(12) United States Patent
Zwenger et al.

(10) Patent No.: US 6,998,702 B1
(45) Date of Patent: Feb. 14, 2006

(54) FRONT EDGE CHAMFER FEATURE FOR FULLY-MOLDED MEMORY CARDS

(75) Inventors: Curtis Michael Zwenger, Chandler, AZ (US); Jeffrey Alan Miks, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 30 days.

(21) Appl. No.: 10/680,281

(22) Filed: Oct. 7, 2003

Related U.S. Application Data

(63) Continuation-in-part of application No. 09/956,190, filed on Sep. 19, 2001, now Pat. No. 6,900,527.

(51) Int. Cl.
*H01L 23/02* (2006.01)

(52) U.S. Cl. .............. 257/679; 257/676; 257/666; 257/723; 257/724

(58) Field of Classification Search ................ 257/679, 257/676, 666, 723–724
See application file for complete search history.

(56) References Cited

U.S. PATENT DOCUMENTS

| | | | |
|---|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |

(Continued)

FOREIGN PATENT DOCUMENTS

DE            19734794 A1     8/1997

(Continued)

*Primary Examiner*—Luan Thai
(74) *Attorney, Agent, or Firm*—Stetina Brunda Garred & Brucker

(57) ABSTRACT

A memory card comprising a leadframe having a plurality of contacts. Electrically connected to the leadframe is at least one semiconductor die. A body at least partially encapsulates the leadframe and includes opposed top and bottom surfaces, an opposed pair of longitudinal sides, and an opposed pair of lateral sides. Each of the contacts of the leadframe is exposed in the bottom surface of the body and includes a chamfer portion which extends to one of the lateral sides thereof.

15 Claims, 1 Drawing Sheet

U.S. PATENT DOCUMENTS

| | | |
|---|---|---|
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,424,576 A | 6/1995 | Djennas et al. |
| 5,428,248 A * | 6/1995 | Cha ............................ 257/676 |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,822,190 A * | 10/1998 | Iwasaki ...................... 361/737 |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,025,640 A | 2/2000 | Yagi et al. |

| | | |
|---|---|---|
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,715 A | 7/2000 | Sawada et al. |
| 6,087,722 A | 7/2000 | Lee et al. |
| 6,100,594 A | 8/2000 | Fukui et al. |
| 6,113,474 A | 9/2000 | Costantini et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,629 B1 | 7/2001 | Niones et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,369,447 B2 | 4/2002 | Mori |
| 6,369,454 B1 | 4/2002 | Chung |
| 6,373,127 B1 | 4/2002 | Baudouin et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,427,976 B1 * | 8/2002 | Huang et al. ................ 257/676 |
| 6,429,508 B1 | 8/2002 | Gang |
| 6,437,429 B1 * | 8/2002 | Su et al. ...................... 257/666 |
| 6,444,499 B1 | 9/2002 | Swiss et al. |
| 6,444,501 B1 * | 9/2002 | Bolken ....................... 438/127 |
| 6,448,633 B1 | 9/2002 | Yee et al. |
| 6,452,279 B2 | 9/2002 | Shimoda |
| 6,464,121 B2 | 10/2002 | Reijnders |
| 6,476,469 B2 | 11/2002 | Hung et al. |
| 6,476,474 B1 | 11/2002 | Hung |
| 6,482,680 B1 | 11/2002 | Khor et al. |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,534,849 B1 | 3/2003 | Gang |
| 6,545,345 B1 | 4/2003 | Glenn et al. |
| 6,559,525 B2 | 5/2003 | Huang |
| 6,566,168 B2 | 5/2003 | Gang |
| 6,624,005 B1 | 9/2003 | DiCaprio et al. |
| 6,663,007 B1 * | 12/2003 | Sun et al. .................... 235/487 |
| 2001/0008305 A1 | 7/2001 | McLellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0140061 A1 | 10/2002 | Lee |
| 2002/0140068 A1 | 10/2002 | Lee et al. |
| 2002/0163015 A1 | 11/2002 | Lee et al. |
| 2003/0029920 A1 * | 2/2003 | Chhor et al. ................. 235/492 |
| 2003/0030131 A1 | 2/2003 | Lee et al. |
| 2003/0073265 A1 | 4/2003 | Hu et al. |
| 2003/0227075 A1 * | 12/2003 | Kanemoto et al. .......... 257/666 |

FOREIGN PATENT DOCUMENTS

| | | |
|---|---|---|
| EP | 5421117 | 6/1979 |
| EP | 5950939 | 3/1984 |
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 098968 | 3/2000 |
| EP | 1032037 | 8/2000 |
| JP | 55163868 | 12/1980 |
| JP | 5745959 | 3/1982 |
| JP | 58160095 | 8/1983 |
| JP | 59208756 | 11/1984 |
| JP | 59227143 | 12/1984 |
| JP | 359227143 A * | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 629639 | 1/1987 |
| JP | 63067762 | 3/1988 |
| JP | 63205935 | 8/1988 |
| JP | 63233555 | 9/1988 |

| | | | | | |
|---|---|---|---|---|---|
| JP | 63249345 | 10/1988 | JP | 8222682 | 8/1996 |
| JP | 63316470 | 12/1988 | JP | 8306853 | 11/1996 |
| JP | 64054749 | 3/1989 | JP | 98205 | 1/1997 |
| JP | 1106456 | 4/1989 | JP | 98206 | 1/1997 |
| JP | 1175250 | 7/1989 | JP | 98207 | 1/1997 |
| JP | 1205544 | 8/1989 | JP | 992775 | 4/1997 |
| JP | 401210394 A * | 8/1989 | JP | 9293822 | 11/1997 |
| JP | 1251747 | 10/1989 | JP | 10022447 | 1/1998 |
| JP | 402009692 A * | 1/1990 | JP | 10163401 | 6/1998 |
| JP | 402009693 A * | 1/1990 | JP | 10199934 | 7/1998 |
| JP | 3177060 | 8/1991 | JP | 10256240 | 9/1998 |
| JP | 4098864 | 9/1992 | JP | 00150765 | 5/2000 |
| JP | 5129473 | 5/1993 | JP | 556398 | 10/2000 |
| JP | 5166992 | 7/1993 | JP | 2001060648 | 3/2001 |
| JP | 5283460 | 10/1993 | JP | 200204397 | 8/2002 |
| JP | 692076 | 4/1994 | KR | 941979 | 1/1994 |
| JP | 6140563 | 5/1994 | KR | 9772358 | 11/1997 |
| JP | 6260532 | 9/1994 | KR | 100220154 | 6/1999 |
| JP | 7297344 | 11/1995 | KR | 0049944 | 6/2002 |
| JP | 7312405 | 11/1995 | WO | 9956316 | 11/1999 |
| JP | 864634 | 3/1996 | WO | 9967821 | 12/1999 |
| JP | 8083877 | 3/1996 | | | |
| JP | 8125066 | 5/1996 | | | |

* cited by examiner

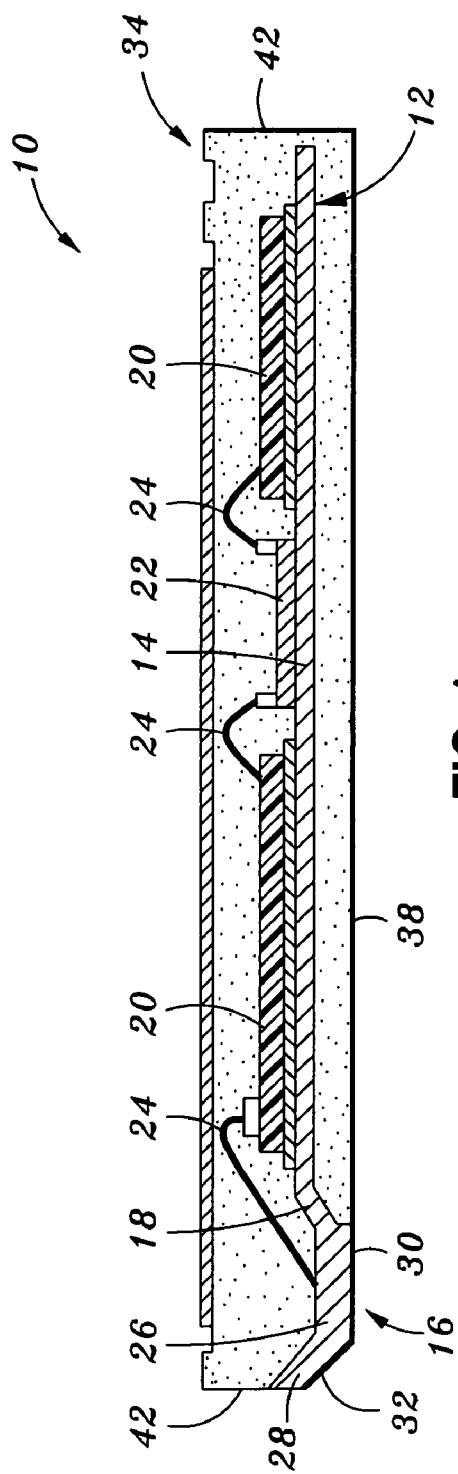
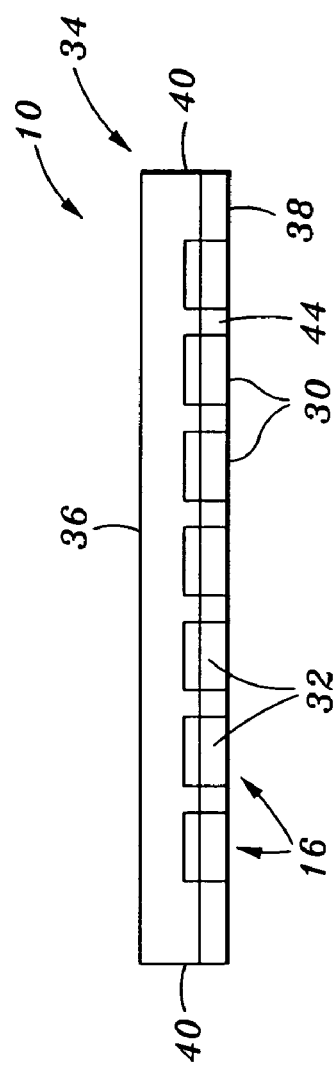
FIG. 1
FIG. 2

FRONT EDGE CHAMFER FEATURE FOR FULLY-MOLDED MEMORY CARDS

CROSS-REFERENCE TO RELATED APPLICATIONS

The present application is a continuation-in-part of U.S. application Ser. No. 09/956,190 entitled LEAD-FRAME METHOD AND ASSEMBLY FOR INTERCONNECTING CIRCUITS WITHIN A CIRCUIT MODULE filed Sep. 19, 2001 now U.S. Pat. No. 6,900,527, the disclosure of which is incorporated herein by reference.

STATEMENT RE: FEDERALLY SPONSORED RESEARCH/DEVELOPMENT

Not Applicable

BACKGROUND OF THE INVENTION

The present invention relates generally to memory cards and, more particularly, to a memory card (e.g., a multi-media card (MMC)) which is configured such that the host socket connector pins travel only over the metallic contacts of the memory card and not any mold compound thereof, thus substantially enhancing the durability of the host socket connector pins.

As is well known in the electronics industry, memory cards are being used in increasing numbers to provide memory storage and other electronic functions for devices such as digital cameras, MP3 players, cellular phones, and personal digital assistants. In this regard, memory cards are provided in various formats, including multi-media cards and secure digital cards.

Typically, memory cards comprise multiple integrated circuit devices or semiconductor dies. The dies are interconnected using a circuit board substrate which adds to the weight, thickness, stiffness and complexity of the card. Memory cards also include electrical contacts for providing an external interface to an insertion point or socket. These electrical contacts are typically disposed on the back side of the circuit board substrate, with the electrical connection to the dies being provided by vias which extend through the circuit board substrate.

In an effort to simplify the process steps needed to fabricate the memory card, there has been developed by Applicant a memory card wherein a leadframe assembly is used as an alternative to the circuit board substrate, as described in Applicant's co-pending U.S. application Ser. No. 09/956,190 entitled LEAD-FRAME METHOD AND ASSEMBLY FOR INTERCONNECTING CIRCUITS WITHIN A CIRCUIT MODULE filed Sep. 19, 2001, of which the present application is a continuation-in-part. As is described in Ser. No. 09/956,190, the leadframe and semiconductor die of the memory card are covered with an encapsulant which hardens into a cover or body of the memory card. The body is sized and configured to meet or achieve a "form factor" for the memory card. In the completed memory card, the contacts of the leadframe are exposed within a common surface of the body, with a die pad of the leadframe and the semiconductor die mounted thereto being disposed within or covered by the body.

Applicant has previously determined that the molding or encapsulation process used to form the body of the card sometimes gives rise to structural deficiencies or problems within the resultant memory card. These problems include portions of the die pad of the leadframe being exposed in the body of the memory card, flash being disposed on the contacts of the leadframe, chipping in a peripheral flange area of the body, and mold gate pull-out wherein a portion of the mold or encapsulating compound is pulled out from within the body, leaving a small recess or void therein. To address these particular problems, Applicant has previously developed a memory card having a "die down" configuration attributable to the structural attributes of the leadframe included therein, and an associated molding methodology employed in the fabrication of such memory card. This die-down memory card is disclosed in Applicant's co-pending U.S. application Ser. No. 10/266,329 entitled DIE DOWN MULTI-MEDIA CARD AND METHOD OF MAKING SAME filed Oct. 8, 2002, the disclosure of which is also incorporated herein by reference.

Memory cards, such as multi-media cards, are used by advancing the same into a host socket which includes a plurality of connector pins. Many host sockets include nine connector pins to accommodate the seven contacts included in many memory card formats such as multi-media cards, and the nine contacts included in the secure digital card memory card format. In current memory cards, the bottom surfaces of the contacts are exposed in and substantially flush with the bottom surface of the body of the memory card. A relatively narrow rail or segment of the body extends between and thus separates the contacts from the lateral side of the body which is advanced into the host socket. As a result, the connector pins of the host socket must travel over this rail or segment of the mold compound of the body prior to engaging the exposed bottom surfaces of the contacts of the memory card. The travel or rubbing of the connector pins on the mold compound tends to rapidly wear out the connector pins, especially when the mold compound contains high levels of filler material. As a result, the host socket connector pins are unable to survive the typical mating insertion requirement of ten thousand insertion cycles.

The present invention addresses and overcomes the above-described deficiencies of currently known memory cards by providing a memory card which is specifically configured to eliminate the travel of the host socket connector pins over the mold compound of the body of the memory card. More particularly, the memory card of the present invention includes a leadframe which has an external signal contact (ESC) feature which is placed to prevent damage to the host socket connector pins or contacts during memory card insertion into the host socket. These and other attributes of the present invention will be described in more detail below.

BRIEF SUMMARY OF THE INVENTION

In accordance with the present invention, there is provided a memory card which is configured in a manner such that the host socket connector pins of a host socket do not travel over the mold compound of the body of the memory card as a result of an insertion cycle of the memory card into the host socket. More particularly, in accordance with the present invention, the seven contacts or connector pins of a memory card (i.e., a multi-media card) or the nine contacts or connector pins of a secure digital card are extended to the adjacent lateral side of the card body and provided with an external signal contact (ESC) feature so that the host socket connector pins slide or travel only over the contacts of the memory card. This ESC feature comprises an external chamfer on the leading edge of the card which allows the host socket connector pins to hit only the metal of the card contacts, and not the abrasive, fully molded card body.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIG. 1 is a cross-sectional view of a memory card constructed in accordance with the present invention; and FIG. 2 is a front elevational view of the memory card shown in FIG. 1.

Common reference numerals are used throughout the drawings and detailed description to indicate like elements.

DETAILED DESCRIPTION OF THE INVENTION

Referring now to the drawings wherein the showings are for purposes of illustrating preferred embodiments of the present invention only, and not for purposes of limiting the same, FIGS. 1 and 2 depict a memory card 10 which is constructed in accordance with the present invention. As shown in FIG. 1, the memory card 10 has a form factor particularly suited for use in a multi-media card memory application. However, those of ordinary skill in the art will recognize that the memory card 10 may have alternative memory card formats, including those of secure digital cards (SDC), compact flash (CF), memory stick, and other small form factor memory cards.

The memory card 10 includes a leadframe 12 having a die attach area or die pad 14 and a plurality of contacts 16. The die pad 14 defines opposed, generally planar top and bottom surfaces. Integrally connected to and extending from each of the contacts 16 is a conductive trace 18. The traces 18 terminate in close proximity to the die pad 14.

In the memory card 10, attached to the top surface of the die pad 14 are multiple semiconductor dies 20 and a passive device 22. Such attachment is preferably facilitated through the use of an epoxy or adhesive. Subsequent to such attachment, the pads or terminals of the semiconductor dies 20 and passive device 22 are electrically connected to each other and to one or more of the traces 18, contacts 16, and/or die pad 14 through the use of conductive wires 24 or equivalent standard interconnect technology (e.g., flip chip, solder attach, etc).

The contacts 16 of the leadframe 10 each include a base portion 26 and a chamfer portion 28 which is integral with and extends angularly relative to the base portion 26. The base portion 26 defines a generally planar bottom surface 30, with the chamfer portion 28 itself defining a generally planar outer chamfer surface 32. The chamfer surface 32 extends at an angle in the range of from about thirty degrees to about sixty degrees, and preferably about 45 degrees, relative to the bottom surface 30 of the base portion 26. The functionality of the chamfer portion 28 of each contact 16 will be discussed in more detail below.

The leadframe 12 is preferably fabricated from a conductive metal material (e.g., copper) through either a chemical etching or mechanical stamping process. The leadframe 12 may be formed to include any number of contacts 16 depending on the desired application for the memory card 10. As shown in FIGS. 1 and 2, the memory card 10 includes seven contacts 16 which is the typical number included for a multi-media card application. The leadframe 12 of the memory card 10 may further be configured to define more than one die pad 14 for accommodating one or more semiconductor dies 20 alone or in combination with other devices such as the passive device 22. Further, though multiple semiconductor dies 20 and the passive device 22 are shown as being attached to the top surface of the single die pad 14 in FIG. 1, one semiconductor die 20 alone or in combination with one or more other devices can be attached to the single die pad 14, or to respective ones of multiple die pads. Moreover, one or more semiconductor dies 20 alone or in combination with one or more passive devices 22 may be attached to a common interposer or laminate substrate, which is in turn attached to a die pad 14 of the leadframe 12. One or more passive devices 22 may also be attached to a common interposer disposed on a separate die pad 14, or on the same die pad 14 to which one or more semiconductor dies 20 is/are mounted. The pattern of the conductive traces 18 may also be varied depending upon the number and arrangement of die pads and the number of semiconductor dies and/or other passive devices included in the memory card 10. Thus, the configuration of the leadframe 12 of the memory card 10 is variable, in that the number and arrangement of die pads, contacts, and conductive traces may be varied as needed to satisfy the requirements of a particular application. Along these lines, the number and arrangement of the semiconductor dies 20 and passive device 22 shown in FIG. 1 is exemplary only, in that such number and arrangement may also be varied based on specific application requirements. Typically, at least the bottom surfaces 30 of the base portions 26 of each of the contacts 16 will be coated with a conductive material.

In fabricating the memory card 10, an encapsulant material or molding compound is applied to the leadframe 12, the semiconductor die(s) 20, and any conductive wires 24 used to electrically connect the semiconductor die(s) 20 to the die pad(s)14, traces 18, and/or contacts 16. The molding compound is preferably a plastic (e.g., thermoset, thermoplastic) which, upon hardening, forms a body 34 of the memory card 10. The completely formed body 34 defines a generally planar top surface 36, an opposed, generally planar bottom surface 38, an opposed pair of longitudinal edges or sides 40, and an opposed pair of lateral edges or sides 42. The body 34 may also define a fifth angled side which extends between one of the longitudinal sides 40 and one of the lateral sides 42. The body 34 is formed such that the bottom surfaces 30 of the base portions 26 of the contacts 16 are exposed in and substantially flush with the bottom surface 38 of the body 34.

As best seen in FIG. 1, in the memory card 10, the distal end of the peripheral portion 28 of each contact 16 extends to and is substantially flush with the lateral side 42 of the body 34 which is disposed closest to the contacts 16. The extension of the contacts 16, and in particular the chamfer portions 28 thereof, to such lateral side 42 represents a substantial departure from existing memory cards wherein a continuous, relatively narrow rail or segment of the body extends between the contacts and the lateral side of the body disposed closest thereto. As indicated above, the travel or rubbing of the connector pins of the host socket over such rail segment of the body substantially accelerates the wear of the connector pins, thus resulting in the inability of existing memory cards to meet or exceed the typical requirement of ten thousand insertion cycles without failure.

In the memory card 10, it is contemplated that the body 34 will be formed to include a generally planar sloped surface 44 which extends angularly between the bottom surface 38 and the lateral side 42 to which the distal ends of the chamfer portions 28 of the contacts 16 extend. In this regard, the outer surface 32 of the chamfer portion 28 of each of the contacts 16 is preferably substantially flush with the sloped surface 44 of the body 34. Thus, the outer surfaces 32 of the chamfer portions 28 of the contacts 16 and sloped surface 44 of the body 34 collectively create an external chamfer on the leading edge of the memory card 10 which ensures metal-to-metal contact between the exposed surfaces of the contacts 16 and the connector pins of the host socket connector. In this regard, such chamfer on the leading edge of the memory card 10 allows the connector pins of the host socket to hit only metal, as opposed to the abrasive, fully-molded body 34 of the memory card 10.

To achieve the above-described orientations between the contacts 16 and the body 34 in the memory card 10, it is contemplated that the body 34 will be molded in a manner achieving a desired form factor which, in the case of the memory card 10, is a multi-media card form factor as indicated above. The molding techniques which may be employed to facilitate the formation of the body 34 with a prescribed form factor are described with particularity in U.S. application Ser. No. 10/266,329 which, as indicated above, is incorporated herein by reference. In this regard, the memory card fabrication methodology wherein a "skin" is mated to a circuit module as also described in U.S. application Ser. No. 10/266,329 is not well suited for the memory card 10 since such skin would typically define the undesirable rail or segment of material between the contacts 16 and the lateral side 42 of the memory card 10 which is disposed closest to the contacts 16, such lateral side being defined by the skin itself. Additionally, in the memory card 10, it is contemplated that the semiconductor die(s) 20 alone or in combination with the passive device(s) 22 may be attached to the bottom surface of the die pad(s) 14 in a "die down" configuration as described in U.S. application Ser. No. 10/266,329. Further, it is contemplated that the above-described chamfer feature may be used in a secure digital card application wherein the card includes nine contacts rather than the seven contacts 16 included in the memory card 10.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A memory card comprising:
    a leadframe having a plurality of contacts;
    at least one semiconductor die electrically connected to the leadframe; and
    a body at least partially encapsulating the leadframe and including:
        opposed top and bottom surfaces;
        an opposed pair of longitudinal sides; and
        an opposed pair of lateral sides;
    each of the contacts of the leadframe being exposed in the bottom surface of the body and including a chamfer portion which extends to one of the lateral sides thereof.

2. The memory card of claim 1 wherein:
    the bottom surface of the body is generally planar; and
    each of the contacts defines a generally planar bottom surface which extends to the chamfer portion and is substantially flush with the bottom surface of the body.

3. The memory card of claim 2 wherein:
    the leadframe includes at least one die pad having opposed, generally planar top and bottom surfaces, and a plurality of conductive traces which extend from respective ones of the contacts toward the die pad;
    the traces are bent in a manner wherein the top surface of the die pad and the bottom surfaces of the contacts extend along respective ones of spaced, generally parallel frame planes, and the bottom surface of the die pad extends along a pad plane which is disposed between and generally parallel to the frame planes; and
    the semiconductor die is attached to the top surface of the die pad.

4. The memory card of claim 2 wherein the chamfer portion of each of the contacts extends at an angle in the range of from about thirty degrees to about sixty degrees relative to the bottom surface thereof.

5. The memory card of claim 4 wherein the chamfer portion of each of the contacts extends at an angel of about forty-five degrees relative to the bottom surface thereof.

6. The memory card of claim 1 wherein the leadframe includes seven contacts.

7. The memory card of claim 1 wherein:
    the body further includes a generally planar sloped surface which extends between the bottom surface and one of the lateral sides thereof;
    the chamfer portion of each of the contacts defines a generally planar chamfer surface which is substantially flush with the sloped surface of the body.

8. In a memory card having a leadframe including a plurality of contacts, at least one semiconductor die electrically connected to the leadframe, and a body at least partially encapsulating the leadframe and defining opposed top and bottom surfaces, an opposed pair of longitudinal sides, and an opposed pair of lateral sides, the improvement comprising:
    forming each of the contacts to include a chamfer portion which extends to one of the lateral sides of the body and a bottom surface which extends to the chamfer portion and is exposed in the bottom surface of the body.

9. A memory card for insertion into a host socket connector having a plurality of connector pins, the memory card comprising:
    a leadframe having a plurality of contacts;
    at least one semiconductor die electrically connected to the leadframe; and
    a body at least partially encapsulating the leadframe and including:
        opposed top and bottom surfaces;
        an opposed pair of longitudinal sides; and
        an opposed pair of lateral sides;
    each of the contacts of the leadframe being exposed in the bottom surface of the body, the memory card including a means for preventing the connector pins from contacting the body upon the insertion of the memory card into the host socket connector.

10. The memory card of claim 9 wherein the means for preventing the connector pins from contacting the body comprises:
    a chamfer portion which is formed in each of the contacts and defines a generally planar chamfer surface; and
    a generally planar sloped surface which is formed in the body between the bottom surface and one of the lateral sides thereof;
    the chamfer surface of each of the contacts being substantially flush with the sloped surface of the body.

11. The memory card of claim 10 wherein:
    the bottom surface of the body is generally planar; and each of the contacts defines a generally planar bottom surface which extends to the chamfer portion and is substantially flush with the bottom surface of the body.

12. The memory card of claim 11 wherein:
the leadframe includes at least one die pad having opposed, generally planar top and bottom surfaces, and a plurality of conductive traces which extend from respective ones of the contacts toward the die pad;
the traces are bent in a manner wherein the top surface of the die pad and the bottom surfaces of the contacts extend along respective ones of spaced, generally parallel frame planes, and the bottom surface of the die pad extends along a pad plane which is disposed between and generally parallel to the frame planes; and
the semiconductor die is attached to the top surface of the die pad.

13. The memory card of claim 11 wherein the chamfer portion of each of the contacts extends at an angle in the range of from about thirty degrees to about sixty degrees relative to the bottom surface thereof.

14. The memory card of claim 13 wherein the chamfer portion of each of the contacts extends at an angel of about forty-five degrees relative to the bottom surface thereof.

15. The memory card of claim 9 wherein the leadframe includes seven contacts.

* * * * *